United States Patent
An et al.

(10) Patent No.: US 8,519,943 B2
(45) Date of Patent: Aug. 27, 2013

(54) LIQUID CRYSTAL DISPLAY DEVICE INCLUDING IMAGE SENSOR AND METHOD OF DRIVING THE SAME

(75) Inventors: Cheung-Hwan An, Seoul (KR); Yong-Won Jo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 1115 days.

(21) Appl. No.: 11/798,299

(22) Filed: May 11, 2007

(65) Prior Publication Data

US 2008/0158120 A1    Jul. 3, 2008

(30) Foreign Application Priority Data

Dec. 29, 2006 (KR) .................. 10-2006-0138466

(51) Int. Cl.
G09G 3/36    (2006.01)

(52) U.S. Cl.
USPC ............................................. 345/104

(58) Field of Classification Search
USPC .......................................... 345/104, 173–178
See application file for complete search history.

(56) References Cited

U.S. PATENT DOCUMENTS

| | | | | |
|---|---|---|---|---|
| 4,655,552 | A * | 4/1987 | Togashi et al. ................. | 349/24 |
| 6,690,346 | B1 * | 2/2004 | Hanano ........................... | 345/98 |
| 2002/0030768 | A1 | 3/2002 | Wu | |
| 2002/0052192 | A1 * | 5/2002 | Yamazaki et al. ............ | 455/411 |
| 2003/0122747 | A1 * | 7/2003 | Shannon et al. ............... | 345/76 |
| 2003/0156087 | A1 * | 8/2003 | Boer et al. ..................... | 345/92 |
| 2003/0174256 | A1 | 9/2003 | Kim et al. | |
| 2005/0139751 | A1 | 6/2005 | Park et al. | |
| 2005/0243023 | A1 | 11/2005 | Reddy et al. | |
| 2006/0001914 | A1 | 1/2006 | Mesmer et al. | |
| 2006/0077186 | A1 * | 4/2006 | Park et al. ..................... | 345/173 |
| 2006/0092143 | A1 * | 5/2006 | Kasai et al. ................... | 345/175 |

(Continued)

FOREIGN PATENT DOCUMENTS

| | | |
|---|---|---|
| GB | 2 427 062 A | 12/2006 |
| JP | 06-276352 | 9/1994 |

(Continued)

OTHER PUBLICATIONS

Office Action issued Oct. 30, 2009 in corresponding German Application No. 10 2007 023 030.5-32.

(Continued)

*Primary Examiner* — Chanh Nguyen
*Assistant Examiner* — Sanghyuk Park
(74) *Attorney, Agent, or Firm* — Morgan, Lewis & Bockius LLP

(57) ABSTRACT

A liquid crystal display device includes a first data line and a second data line, the first and second data lines substantially parallel to one another, a first gate line, the first gate line crossing the first data line and the second data line, a display sub-pixel defined by the crossing of the first gate line and the first data line, a sensing sub-pixel defined by the crossing of the first gate line and the second data line, and a first switching element for connecting the second data line connected to one of a sensing processing unit and a ground terminal, wherein the display sub-pixel transmits light supplied from a light source in accordance to a data signal applied to the first data line, and the sensing sub-pixel senses light incident on the liquid crystal display device and generates charges corresponding to the sensed light.

18 Claims, 7 Drawing Sheets

(56) References Cited

U.S. PATENT DOCUMENTS

| | | |
|---|---|---|
| 2006/0187367 A1 | 8/2006 | Abileah et al. |
| 2006/0192766 A1* | 8/2006 | Nakamura et al. ............ 345/173 |
| 2007/0070056 A1* | 3/2007 | Sato et al. ..................... 345/207 |

FOREIGN PATENT DOCUMENTS

| | | |
|---|---|---|
| JP | 2006-343713 | 12/2006 |
| TW | 200425048 A | 11/2004 |
| WO | WO 2008/070288 A1 | 6/2008 |

OTHER PUBLICATIONS

Taiwan Office Action dated Nov. 11, 2011, with English translation.

U.S. Office Action dated Mar. 11, 2010.

* cited by examiner

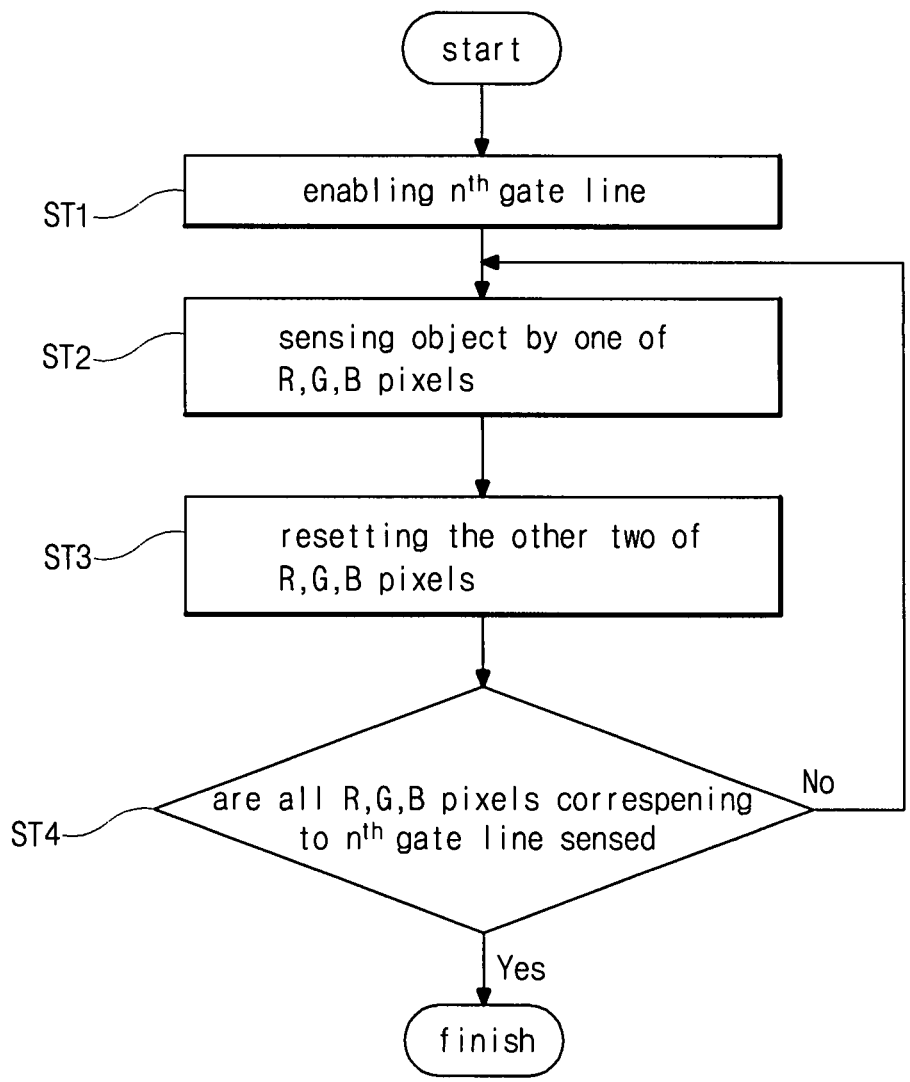

LIQUID CRYSTAL DISPLAY DEVICE INCLUDING IMAGE SENSOR AND METHOD OF DRIVING THE SAME

The invention claims the benefit of Korean Patent Application No. 10-2006-0138466 filed in Korea on Dec. 29, 2006, which is hereby incorporated by reference in its entirety.

BACKGROUND OF THE INVENTION

1. Field of the Invention

Embodiments of the invention relate to a liquid crystal display device, and more particularly, to a liquid crystal display device and the method of driving the same. Although embodiments of the invention are suitable for a wide scope of applications, they are particularly suitable for obtaining a liquid crystal display device including an image sensor and the method of driving the same.

2. Discussion of the Related Art

Liquid crystal display (LCD) devices use the optical anisotropy and polarization properties of liquid crystal molecules to produce an image. The liquid crystal molecules have long and thin shapes, and have the optical anisotropy property, such that the liquid crystal molecules can be aligned along an alignment direction. The liquid crystal molecules also have the polarization property, such that the alignment direction can be changed according to an intensity of an applied electric field. In particular, the arrangement of the liquid crystal molecules can be changed by varying the intensity of the electric field. Consequently, light transmittance of the liquid crystal molecules is controlled by the electric field, and the LCD device displays images due to the changes in light transmittance.

In general, an LCD device includes a liquid crystal panel and a driving circuit. The liquid crystal panel includes first and second substrates spaced apart from each other and a liquid crystal layer between the first and second substrates. The first substrate, which is commonly referred to as an array substrate, has a thin film transistor and a pixel electrode, and the second substrate, which is commonly referred to as a color filter substrate, has a color filter layer and a common electrode. The driving circuit electrically drives the liquid crystal panel. Since the LCD device is a non-emissive type device, the LCD device includes a light source, such as a backlight unit, under the liquid crystal panel.

FIG. 1 is a schematic diagram illustrating an LCD device according to the related art. In FIG. 1, an LCD device includes a liquid crystal panel 10, a gate driver 20, a data driver 40, a timing controller 60 and a backlight unit 80. The liquid crystal panel 10 includes a plurality of gate lines GL1 to GLn and a plurality of data lines DL1 to DLm on a substrate. The plurality of gate lines GL1 to GLn cross the plurality of data lines DL1 to DLm to define a plurality of pixel regions. Each of the pixel regions includes a thin film transistor TFT and a liquid crystal capacitor Clc to display images. The gate driver 20 and the data driver 40 supply driving signals and image signals to the liquid crystal panel 10 through the plurality of gate lines GL1 to GLn and the plurality of data lines DL1 to DLm, and the timing controller 60 controls the gate driver 20 and the data driver 40. The backlight unit 80 is disposed under the liquid crystal panel 10 and supplies light onto the liquid crystal panel 10.

A thin film transistor has been explored for applications as a switching element and also as an image sensing element. The thin film transistor, when functioning as an image sensing element, stores information corresponding to intensity of light and outputs the stored information in response to an external control signal. For example, the thin film transistor, when functioning as an image sensing element, may be used as an image reader of an image treating machine, such as a scanner and a digital duplicator.

Recently, a multi-functional electronic device has been the subject of research and development so that instead of using several traditional goods, a single device can achieve the same results. In addition, a device including an image sensing element is required to have various functions.

Accordingly, an LCD device including an image sensor has been researched and developed. Since an LCD device including an image sensor displays and senses images, such an LCD device including an image sensor has advantages in space utilization and production cost. In an LCD device including an image sensor, however, since a selected pixel receives a sensed data corresponding to an adjacent pixel due to light scattering, a sensed data corresponding to the selected pixel may be interfered.

SUMMARY OF THE INVENTION

Accordingly, embodiments of the invention is directed to a liquid crystal display device and the method of driving the same that substantially obviate one or more of the problems due to limitations and disadvantages of the related art.

An object of the embodiments of the invention is to provide a liquid crystal display device including an image sensor where an interference of a sensed data is prevented and a method of driving the same.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these and other advantages and in accordance with the purpose of embodiments of the invention, as embodied and broadly described, a liquid crystal display device includes a first data line and a second data line, the first and second data lines substantially parallel to one another, a first gate line, the first gate line crossing the first data line and the second data line, a display sub-pixel defined by the crossing of the first gate line and the first data line, a sensing sub-pixel defined by the crossing of the first gate line and the second data line, and a first switching element for connecting the second data line connected to one of a sensing processing unit and a ground terminal, wherein the display sub-pixel transmits light supplied from a light source in accordance to a data signal applied to the first data line, and the sensing sub-pixel senses light incident on the liquid crystal display device and generates charges corresponding to the sensed light.

In another aspect, a liquid crystal display device includes a plurality of first sub-pixels, the first sub-pixels activated to display an image by selectively transmitting light irradiated from a rear side of the device, and a plurality of second sub-pixels, the second sub-pixels selectively activated to sense one color light irradiated onto a front side of the device, wherein the first sub-pixels and the second sub-pixels locate alternatively with one another.

In another aspect, a method of driving a liquid crystal display device includes in a display mode, sequentially activating a first color display sub-pixel, a second color display sub-pixel and a third color display sub-pixel, and in a sensing mode, during a first sub-period, activating a first color sensing sub-pixel, during a second sub-period, activating a second color sensing sub-pixel, and during a third sub-period, activating a third color sensing sub-pixel.

In another aspect, a method of driving a liquid crystal display device having first, second and third pixels, each of the first, second and third pixels having a display sub-pixel and a sensing sub-pixel includes transmitting a first light through the display sub-pixel and sensing a second light in the sensing sub-pixel of one of the first, second and third pixels, and shielding the first light in the display sub-pixels of the other two of the first, second and third pixels.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention. In the drawings:

FIG. 7 is a flow chart illustrating a sensing process in an LCD device according to an embodiment of the invention.

DETAILED DESCRIPTION OF THE PREFERRED EMBODIMENTS

Reference will now be made in detail to the preferred embodiments of the invention, examples of which are illustrated in the accompanying drawings.

Figure 1:
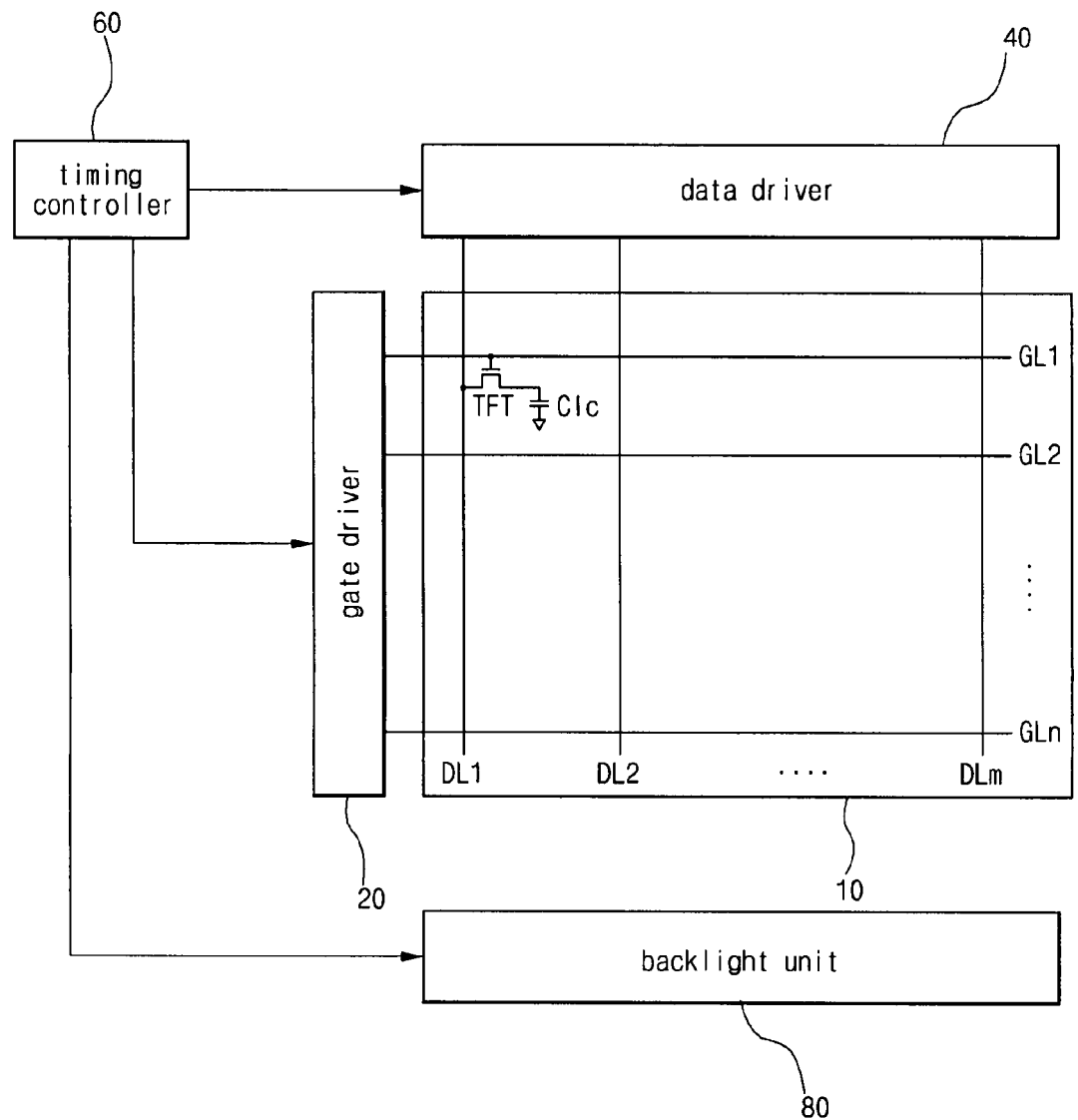
FIG. 1 is a schematic diagram illustrating an LCD device according to the related art.
Figure 2:
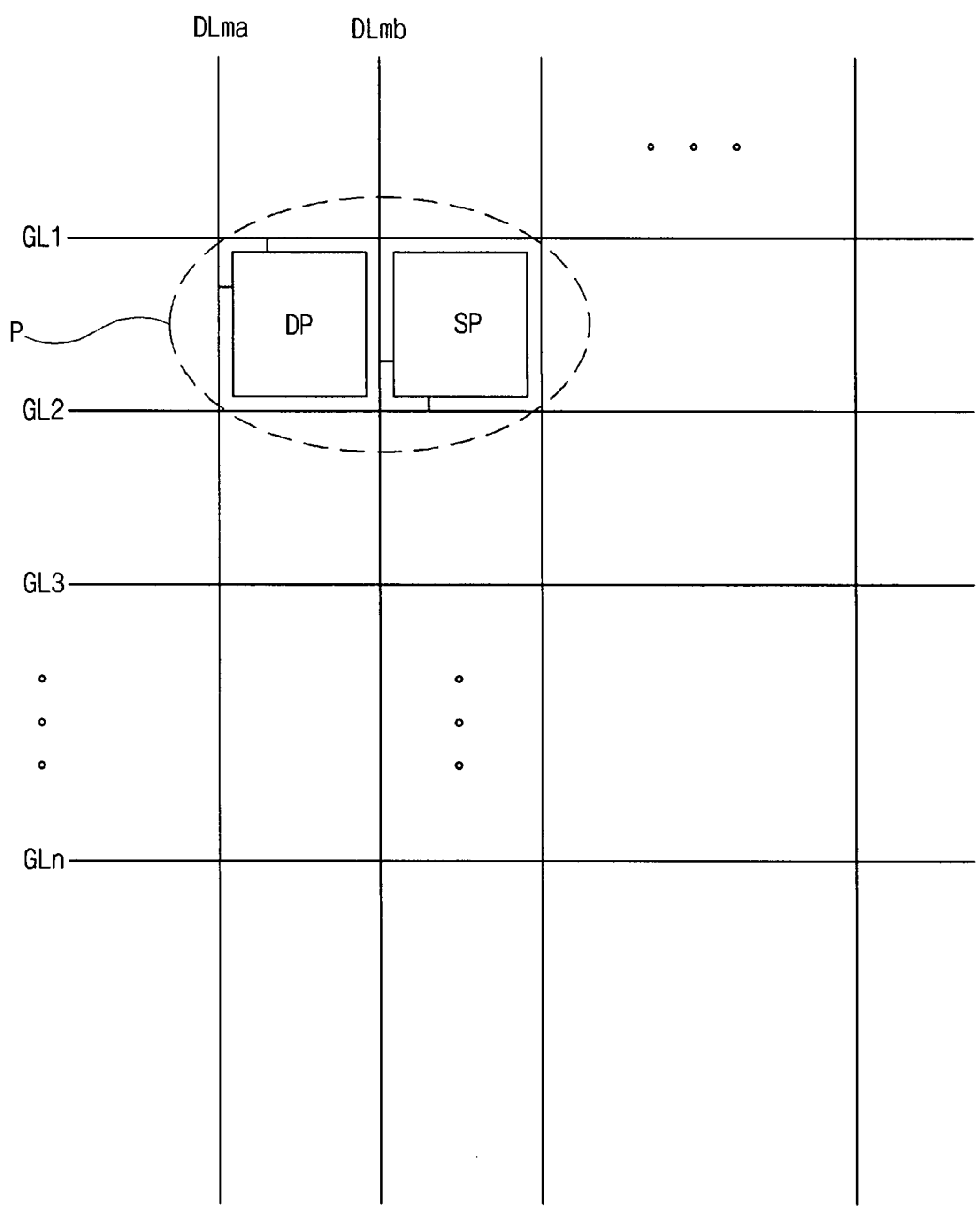
FIG. 2 is a schematic diagram illustrating a liquid crystal display device according to an embodiment of the invention.

FIG. 2 is a schematic diagram illustrating a liquid crystal display device according to an embodiment of the invention. In FIG. 2, a liquid crystal display (LCD) device having a display mode and a sensing mode includes a pixel P having a display sub-pixel DP and a sensing sub-pixel SP. The display sub-pixel DP and the sensing sub-pixel SP are used for the display mode and the sensing mode, respectively. In addition, the LCD device includes a plurality of gate lines GL1 . . . . GLn, a display data line DLma and a sensing data line DLmb. The gate lines GL1 . . . . GLn cross the display data line DLma and the sensing data line DLmb. The display sub-pixel is defined by crossing of the gate lines GL1 . . . . GLn and the display data line DLma, and the sensing sub-pixel is defined by crossing of the gate lines GL1 . . . GLn and the sensing data line DLmb.

A first switching element (not shown) in the display sub-pixel DP is turned on/off in response to a gate signal through the gate line GLn and a display data signal through the display data line DLma is transmitted to the display sub-pixel DP when the first switching element is turned on. Accordingly, the display sub-pixel display images by changing a transmittance of a liquid crystal layer in response to the display data signal. In addition, an image sensor in the sensing sub-pixel SP senses light reflected from an object and generates charges corresponding to the reflected light. A second switching element (not shown) in the sensing sub-pixel SP is turned on/off in response to a sensing gate signal through the gate line GLn and a sensing data signal corresponding to the charges is transmitted to a sensing processing unit through the sensing data line DLmb when the second switching element is turned on.

Although the display sub-pixel DP and the sensing sub-pixel SP are connected to different gate lines to drive the display sub-pixel DP and the sensing sub-pixel SP independently in FIG. 2, the display sub-pixel DP and the sensing sub-pixel SP alternatively may be connected to the same gate line.

Figure 3:
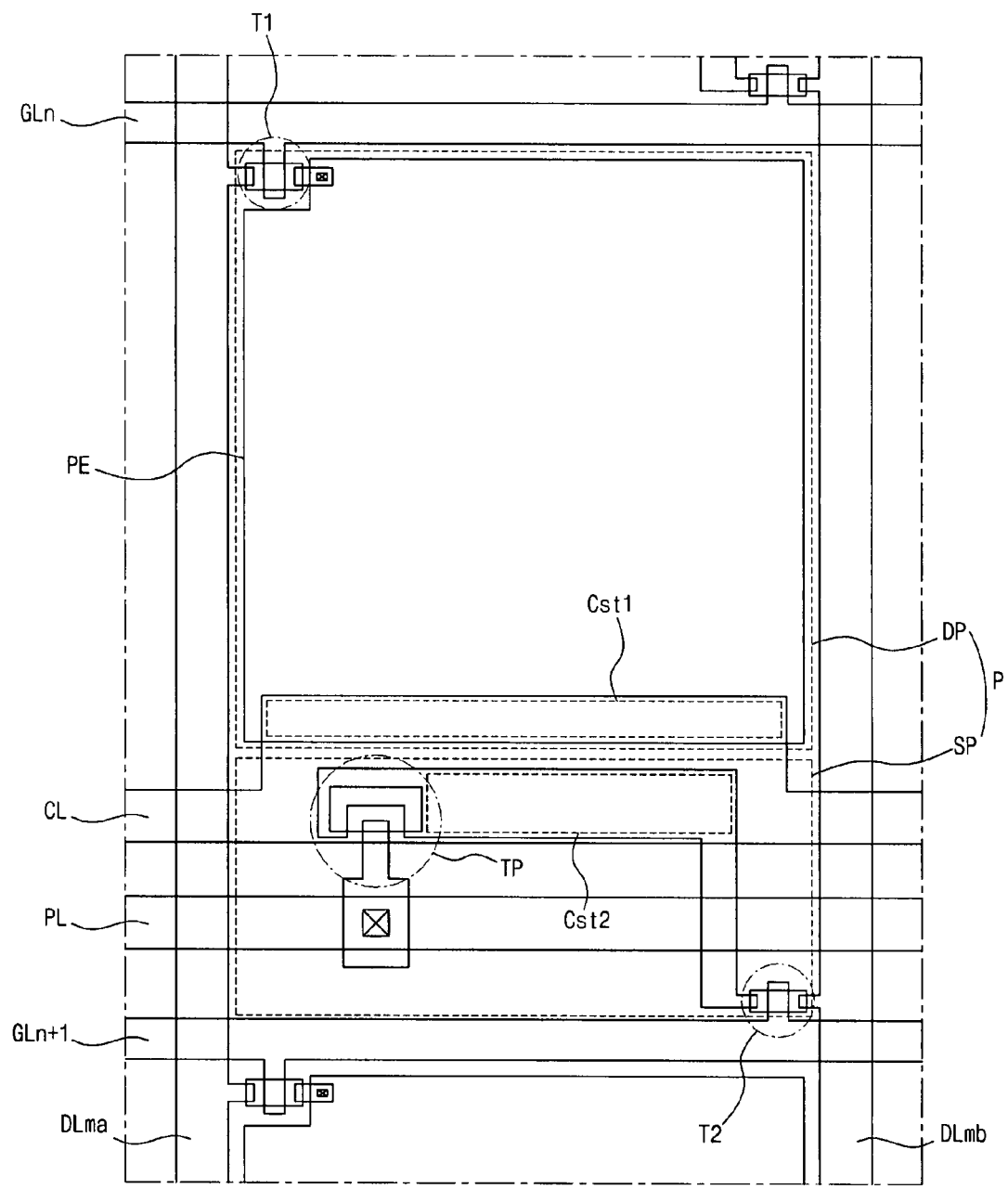
FIG. 3 is a plan view schematic diagram illustrating an array substrate for an LCD device according to an embodiment of the invention.

FIG. 3 is a plan view schematic diagram illustrating an array substrate for an LCD device according to an embodiment of the invention. In FIG. 3, a gate line GLn, a next gate line $GL_{n+1}$, a common line CL, a power line PLn, a display data line DLma and a sensing data line DLmb are formed on a substrate. The gate line GLn, the next gate line $GL_{n+1}$, the common line CL and the power line PLn are parallel to one another, and the display data line DLma and the sensing data line DLmb are parallel to each other. The gate line GLn, the next gate line $GL_{n+1}$, the common line CL and the power line PLn may be formed of the same material as one another, and the display data line DLma and the sensing data line DLmb may be formed of the same material as each other. Further, the gate line GLn, the next gate line $GL_{n+1}$, the common line CL and the power line PLn cross the display data line DLma and the sensing data line DLmb. A pixel P is defined by crossing of the gate line GLn, the display data line DLma and the sensing data line DLmb. The pixel P includes a display sub-pixel DP and a sensing sub-pixel SP.

The display sub-pixel DP includes a first switching element T1 of a thin film transistor (TFT), a first storage capacitor Cst1 and a liquid crystal capacitor (not shown). A gate electrode of the first switching element T1 is connected to the first gate line GLn and a source electrode of the first switching element T1 is connected to the display data line DLma. A pixel electrode PE in the display sub-pixel DP is connected to a drain electrode of the first switching element T1. The pixel electrode PE overlaps the common line CL to form the first storage capacitor Cst1.

The sensing sub-pixel SP includes a sensing element TP of a TFT, a second storage capacitor Cst2 and a second switching element T2 of a TFT. A source electrode of the sensing element TP is connected to the power line PL and a gate electrode of the sensing element TP is connected to the common line CL. A drain electrode of the sensing element TP overlaps the common line CL to form the second storage capacitor Cst2 and is connected to a source electrode of the second switching element T2. A gate electrode of the second switching element T2 is connected to the next gate line $GL_{n+1}$ and a drain electrode of the second switching element T2 is connected to the sensing data line DLmb.

The display sub-pixel DP displays images in accordance with a display data signal applied to the pixel electrode PE through the display data line DLma in a display mode, while the sensing sub-pixel SP senses images and a sensing processing unit (not shown) reads a sensing data signal corresponding to the sensed images through the sensing data line DLmb in a sensing mode.

Although the power line PL is shown to be parallel to the gate line GLn in FIG. 3, the power line PL may be parallel to and formed of the same material as the display and sensing data lines DLma and DLmb in another embodiment. In addition, although the second switching element T2 is connected to the next gate line $GL_{n+1}$ in FIG. 3, the second switching element T2 may be connected to the corresponding gate line GLn or a previous gate line (not shown). Further, although not shown, an LCD device includes an array substrate, a color filter substrate and a liquid crystal layer between the array substrate and the color filter substrate. In addition, the color filter substrate includes a color filter layer and a common electrode.

Figure 4:
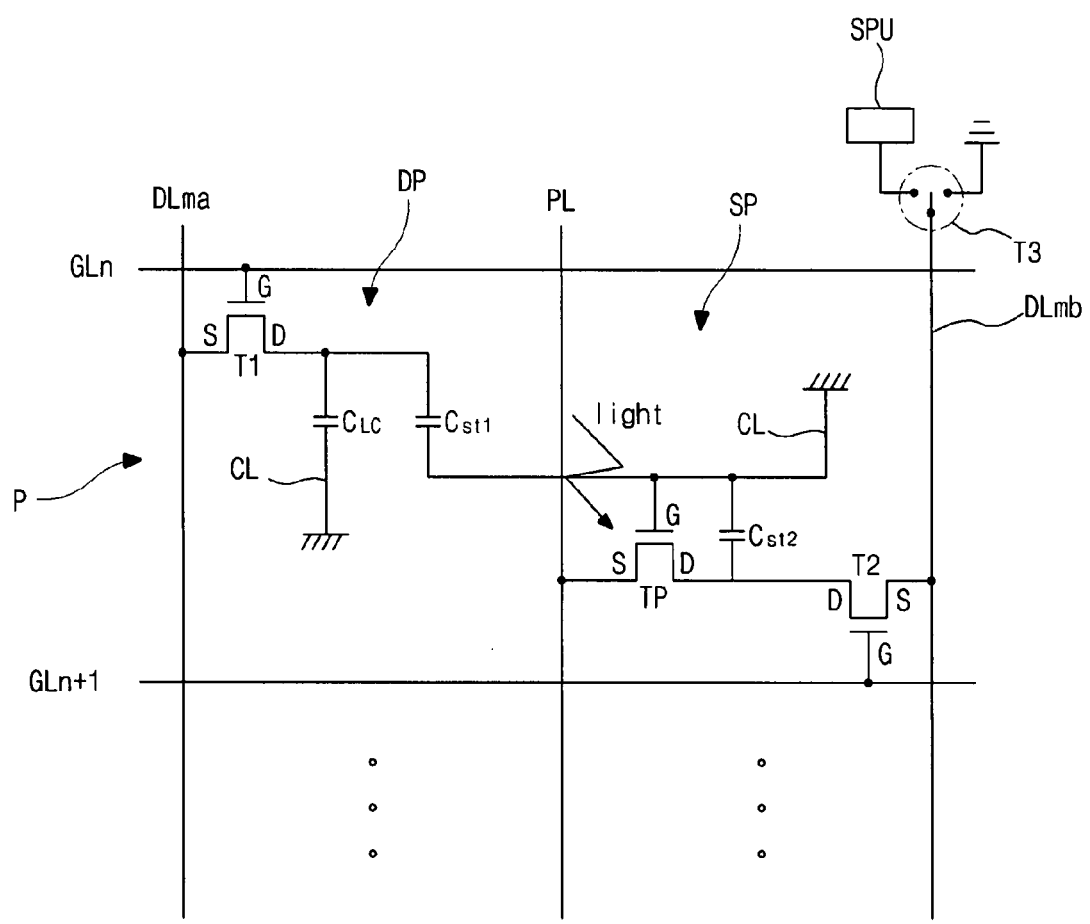
FIG. 4 is an equivalent circuit diagram schematically illustrating an LCD device according to an embodiment of the invention.

FIG. 4 is an equivalent circuit diagram schematically illustrating an LCD device according to an embodiment of the invention. In FIG. 4, an LCD device includes a pixel having a display sub-pixel DP and a sensing sub-pixel SP. The display sub-pixel DP is defined by crossing of an $n^{th}$ gate line GLn, an $m^{th}$ display data line DLma and a power line PL, and the sensing sub-pixel SP is defined by crossing of an $(n+1)^{th}$ gate line GLn+1, an $m^{th}$ sensing data line DLmb and a power line PL.

The display sub-pixel DP displaying images includes a first switching element T1, a liquid crystal capacitor $C_{LC}$ and a first storage capacitor Cst1. The first switching element T1 may include a thin film transistor (TFT). A gate electrode of the first switching element T1 is connected to the $n^{th}$ gate line GLn and a source electrode of the first switching element T1 is connected to the $m^{th}$ display data line DLma. A drain electrode of the first switching element T1 is connected to first electrodes of the liquid crystal capacitor $C_{LC}$ and the first storage capacitor Cst1. Second electrodes of the liquid crystal capacitor $C_{LC}$ and the first storage capacitor Cst1 may be grounded through a common line CL.

The sensing sub-pixel SP sensing images include an image sensor TP, a second storage capacitor Cst2, and a second switching element T2. The image sensor TP and the second switching element T2 may respectively include a thin film transistor (TFT). In addition, the image sensor TP may include a photo transistor. A gate electrode of the image sensor TP is grounded through the common line CL and a source electrode of the image sensor TP is connected to a power line PL. A drain electrode of the image sensor TP is connected to a first electrode of the second storage capacitor Cst2 and a drain electrode of the second switching element T2. A second electrode of the second storage capacitor Cst2 is grounded through the common line CL. A gate electrode of the second switching element T2 is connected to the $(n+1)^{th}$ gate line GLn+1 and a source electrode of the second switching element T2 is connected to the $m^{th}$ sensing data line DLmb.

In FIG. 4, to drive a display mode and a sensing mode independently, the display sub-pixel DP and the sensing sub-pixel SP are connected to the $n^{th}$ and $(n+1)^{th}$ gate lines GLn and GLn+1, respectively. In another embodiment, however, the display sub-pixel DP and the sensing sub-pixel SP may be connected to the same gate line or connected to $n^{th}$ and $(n-1)^{th}$ gate lines GLn and GLn-1 (not shown), respectively.

The LCD device according to an embodiment of the invention can be driven in the display mode and in the sensing mode. In the display mode, a gate signal is sequentially supplied to the $n^{th}$ and $(n+1)^{th}$ gate lines GLn and GLn+1. For example, when the gate signal of a high level voltage is supplied to the $n^{th}$ gate line GLn, the first switching element T1 is turned on. A display data signal supplied to the $m^{th}$ display data line DLma is transmitted to the liquid crystal capacitor $C_{LC}$ and the first storage capacitor Cst1 through the first switching element T1. Accordingly, the liquid crystal capacitor changes transmittance of a liquid crystal layer of the liquid crystal capacitor $C_{LC}$, thereby displaying images corresponding to the display data signal. Although not shown in FIG. 4, a backlight unit supplies light to the liquid crystal capacitor $C_{LC}$. When the gate signal of a low level voltage is supplied to the $n^{th}$ gate line GLn, the first switching element T1 is turned off and a voltage of the liquid crystal capacitor $C_{LC}$ is maintained using charges in the first storage capacitor Cst1.

In the sensing mode, the gate signal is sequentially supplied to the $n^{th}$ and $(n+1)^{th}$ gate lines GLn and GLn+1. For example, when the gate signal of a high level voltage is supplied to the $n^{th}$ gate lines GLn, the first switching element T1 is turned on and the display data signal corresponding to a brightest image is applied to the display sub-pixel DP. The brightest image corresponds to the maximum transmittance of the display sub-pixel DP. Accordingly, light from the backlight unit passes through the display sub-pixel DP, incident on an object that may be in front of the LCD device, and reflects back to the LCD device from the object.

The reflected light enters the image sensor TP of the sensing sub-pixel SP and a photo current corresponding to an intensity of the reflected light is generated in the image sensor TP. The photo current of the image sensor TP is stored in the second storage capacitor Cst2 as charges corresponding to the intensity of the reflected light. When the gate voltage of a high level voltage is supplied to the $(n+1)^{th}$ gate line GLn+1, the second switching element T2 is turned on and the charges in the second storage capacitor Cst2 are read by a sensing processing unit SPU through the $m^{th}$ sensing data line DLmb as a sensing data signal. The sensing processing unit SPU may include a read out integrated circuit (ROIC) and the sensing data signal may be stored in an additional memory.

When the LCD device according to an embodiment of the invention displays and senses color images, the pixel P may be classified into red, green and blue pixels R, G and B. In the sensing mode, the LCD device sequentially senses and reads red, green and blue colors of the images. Accordingly, while a selected color is sensed and read in the selected colored pixel, a display data signal corresponding to a darkest image is applied to the display sub-pixel DP of the other colored pixels and light from the backlight unit is blocked. The darkest image corresponds to the minimum transmittance of the display sub-pixel DP. As a result, the other colors are not sensed and read while the selected color is sensed and read and a sensing accuracy of the LCD device is improved.

However, the reflected light corresponding to the selected color may enter the other colored pixels due to light scattering and abnormal charges may be stored in the second storage capacitor in the sensing sub-pixel of the other colored pixels. To reset the abnormal charges, the LCD device according to an embodiment of the invention may further include a third switching element T3, such as three-way switch connected to the $m^{th}$ sensing data line DLmb. The $m^{th}$ sensing data line DLmb may be connected to the sensing processing unit SPU or may be grounded by the third switching element T3. While the normal charges of the sensing data signal are stored in the second storage capacitor Cst2, the $m^{th}$ sensing data line DLmb is connected to the sensing processing unit SPU and the normal charges are read. While the abnormal charges are stored in the second storage capacitor Cst2, the $m^{th}$ sensing data line DLmb is grounded and the abnormal charges are reset. Accordingly, the third switching element T3 connects $m^{th}$ sensing data line DLmb to the sensing processing unit SPU in sync with the display data signal corresponding to the brightest image.

Figure 5:
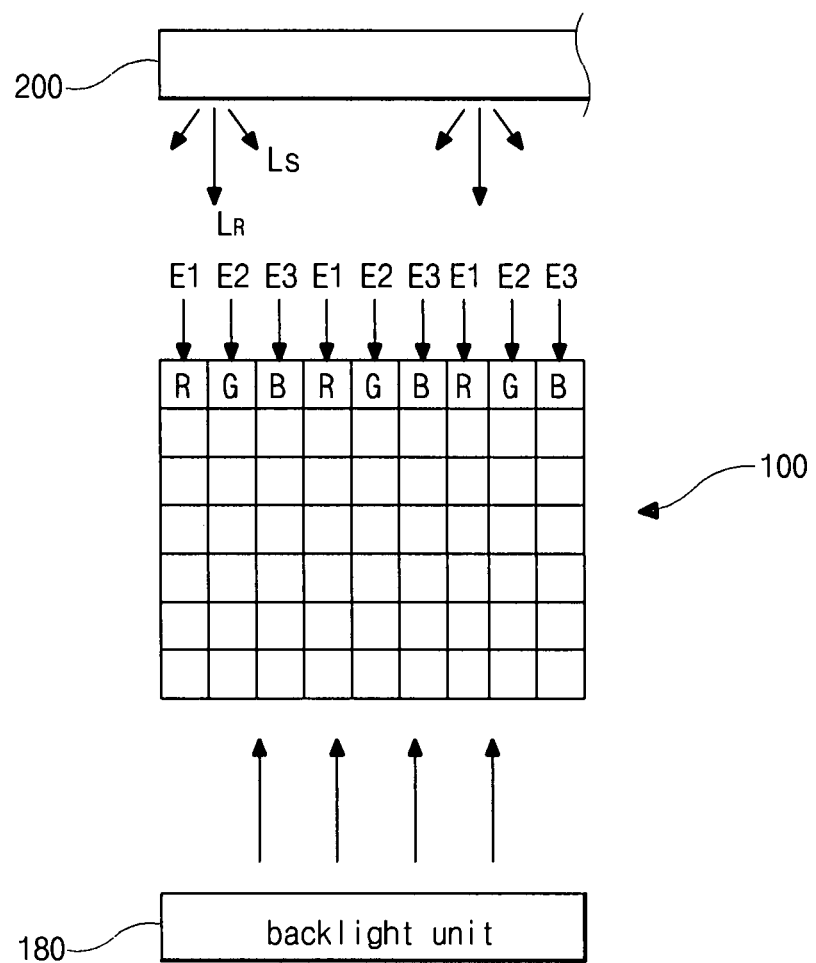
FIG. 5 is a schematic diagram illustrating a method of driving an LCD device according to an embodiment of the invention.
Figure 6:
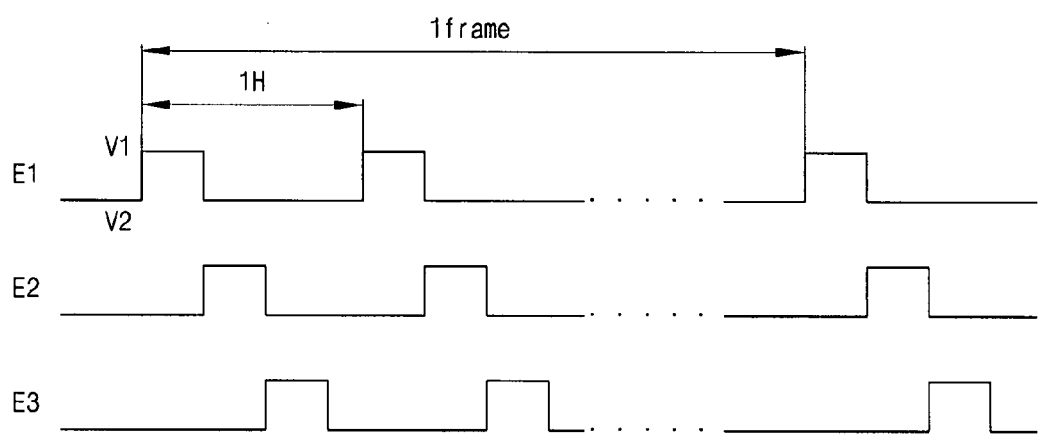
FIG. 6 is a timing chart illustrating display data signals for an LCD device in a sensing mode according to an embodiment of the invention.

FIG. 5 is a schematic diagram illustrating a method of driving an LCD device according to an embodiment of the invention, and FIG. 6 is a timing chart illustrating display data signals for an LCD device in a sensing mode according to an embodiment of the invention. In FIG. 5, an LCD device operating in a display mode and a sensing mode includes a liquid crystal panel 100 and a backlight unit 180. An object 200 for sensing is disposed in front of the LCD device. The liquid crystal panel 100 includes red, green and blue pixels R, G and B displaying and sensing red, green and blue colors, respectively. The backlight unit 180 supplies light to the liquid crystal panel 100.

In the sensing mode, the light from the backlight unit 180 passes through a display sub-pixel DP (of FIG. 4), incidents on the object 200 and reflects from the object 200. The reflected light enters a sensing sub-pixel SP (of FIG. 4) to be stored as a sensing data signal and a sensing processing unit SPU (of FIG. 4) reads the sensing data signal to recognize the object. A gate signal is sequentially supplied to gate lines of the liquid crystal panel 100. During one horizontal time period, the gate signal of a high level voltage is supplied to a selected gate line, and a display data signal is applied to the display sub-pixel DP (of FIG. 4) corresponding to the selected gate line. Here, the display data signal is not applied to the red, green and blue pixels R, G and B at the same time. Accordingly, the display data signal may be classified into first, second and third display data signals E1, E2 and E3 for the red, green and blue pixels R, G and B, respectively.

As shown in FIG. 6, for example, each of the first, second and third display data signals E1, E2 and E3 of the sensing mode has a first voltage V1 corresponding to a brightest image and a second voltage corresponding to the darkest image. The first voltage V1 is maintained during about one-third of one horizontal time period H1 and the second voltage V2 is maintained during about two-third of the one horizontal time period H2. In addition, the first voltage V1 is repeated every horizontal time period H1. While the first display data signal E1 has the first voltage V1, the second and third display data signals E2 and E3 have the second voltage V2. Similarly, the third and first display data signals E3 and E1 have the second voltage V2 while the second display data signal E2 has the first voltage V1, and the first and second display data signals E1 and E2 have the second voltage V2 while the third display data signal E3 has the first voltage V1. Accordingly, one of the first, second and third display data signals E1, E2 and E3 has the first voltage V1 and the other two of the first, second and third display data signals E1, E2 and E3 have the second voltage V2. Further, the first, second and third display data signals E1, E2 and E3 sequentially have the first voltage V1 during the one horizontal time period H1.

Referring again to FIG. 5, when the first voltage V1 of the display data signal is applied to the display sub-pixel DP (of FIG. 4), the display sub-pixel DP transmits light from the backlight unit 180. In addition, when the second voltage V2 of the display data signal is applied to the display sub-pixel DP, the display sub-pixel DP shields light from the backlight unit 180. Since the first, second and third display data signals E1, E2 and E3 sequentially have the first voltage V1 (of FIG. 6), the display sub-pixels DPs of the red, green and blue pixels R, G and B sequentially transmits light from the backlight unit 180, and red, green and blue colored light are sequentially irradiated onto the object 200.

For example, the display sub-pixel DP of the red pixel R may transmit light and the display sub-pixels DPs of the green and blue pixels G and B may shield light during the first one-third of the one horizontal time period 1H (of FIG. 6). Similarly, the display sub-pixel DP of the green pixel G may transmit light and the display sub-pixels DPs of the blue and red pixels B and R may shield light during the second one-third of the one horizontal time period 1H. In addition, the display sub-pixel DP of the blue pixel B may transmit light and the display sub-pixels DPs of the red and green pixels R and G may shield light during the third one-third of the one horizontal time period 1H. Therefore, red, green and blue colored light sequentially reflect from the object and the reflected red, green and blue colored light $L_R$ are sequentially sensed by the sensing sub-pixels SPs (of FIG. 4) of the red, green and blue pixels R, G and B.

For example, during the first one-third of the one horizontal time period 1H, the red colored light is irradiated onto the object. Although most of the red colored light reflects with an orthogonal angle with respect to a surface of the object, some of the red colored light is scattered at the object with an oblique angle with respect to the surface of the object. Accordingly, the reflected red colored light $L_R$ enters the sensing sub-pixel SP of the red pixel R and the scattered red colored light $L_S$ enters the sensing sub-pixels SPs of adjacent green and blue pixels G and B. In the sensing sub-pixel SP of the red pixel R, the reflected red light $L_R$ is sensed by the image sensor TP and stored in the second storage capacitor Cst2 as a normal sensing data signal. The normal sensing data signal is transmitted to the sensing processing unit SPU (of FIG. 4) through the $m^{th}$ sensing data line DLmb while the second switching element T2 is turned on. In the sensing sub-pixels SPs of the adjacent green and blue pixels G and B, the scattered red light $L_S$ is sensed by the image sensors TPs and is stored in the second storage capacitor Cst2 as a dummy sensing data signal. The dummy sensing data signal distorts normal sensing data signals corresponding to the reflected green and blue colored light in the subsequent second and third one-thirds of the one horizontal time period 1H.

To solve the above problem of the dummy sensing data signal, the dummy sensing data signal may be reset. As shown in FIG. 4, a third switching element T3 is connected to the $m^{th}$ sensing data line DLmb to select one of the sensing processing unit SPU such as a read out integrated circuit ROIC and the ground terminal. Accordingly, during the first one-third of the one horizontal time period 1H, the third switching element T3 of the red pixel R connects the $m^{th}$ sensing data line DLmb and the sensing processing unit SPU, and the third switching elements T3 of the green and blue pixels G and B ground the $m^{th}$ sensing data line DLmb. As a result, during the first one-third of the one horizontal time period 1H, the normal sensing data signal corresponding to the reflected red colored light $L_R$ is transmitted to the sensing processing unit SPU and the dummy sensing data signal corresponding to the scattered red colored light $L_S$ is transmitted to the ground terminal, i.e., the dummy sensing data signal is reset to discharge the second storage capacitor Cst2 in the green and blue pixels G and B.

Similarly, during the second one-third of the one horizontal time period 1H, the $m^{th}$ sensing data line DLmb of the green pixel G is connected to the sensing processing unit SPU and the $m^{th}$ sensing data lines DLmb of the blue and red pixels B and R are grounded. Accordingly, the normal sensing data signal corresponding to the reflected greed colored light $L_R$ is transmitted to the sensing processing unit SPU and the dummy sensing data signal corresponding to the scattered green colored light $L_S$ is reset. Similar process is performed during the third one-third of the one horizontal time period 1H.

In the LCD device according to an embodiment of the invention, since the reflected red, green and blue colored light are sequentially and independently sensed, interference between colors is prevented and a sensing property is improved. In addition, since the dummy sensing data signal corresponding to the scattered light is reset, distortion by the dummy sensing data signal is prevented and the sensing property is further improved.

FIG. 7 is a flow chart illustrating a sensing process in an LCD device according to an embodiment of the invention. As shown in FIG. 7, at a first step ST1, an $n^{th}$ gate line is enabled. For example, a gate signal of a high level voltage is supplied to the $n^{th}$ gate line and a first switching element T1 (of FIG. 4) is turned on.

At a second step ST2, an object is sensed by one of red, green and blue pixels R, G and B (of FIG. 5). For example, a first voltage V1 (of FIG. 6) corresponding to a brightest image is applied to a display sub-pixel DP (of FIG. 4) of the red pixel R and a second voltage V2 (of FIG. 6) corresponding to the darkest image is applied to display sub-pixels DP of the green and blue pixels G and B. Accordingly, light from a backlight unit 180 (of FIG. 5) passes through the display sub-pixel DP of the red pixel R and is blocked in the display sub-pixels DP of the green and blue pixels G and B. The light reflecting from the object is sensed by a sensing sub-pixel SP (of FIG. 4) of the red pixel R and stored as a normal sensing data signal.

At a third step ST3, sensing data signals of the other two of red, green and blue pixels R, G and B are reset. When light passing through the display sub-pixel DP of the red pixel R is scattered at the object, the scattered light is stored in the sensing sub-pixel SP of the green and blue pixels G and B as a dummy sensing data signal. While the $n^{th}$ gate line is enabled, the second switching element T2 (of FIG. 4) is turned on. As a result, the dummy sensing data signals of the green and blue pixels G and B are reset, while the normal sensing data signal of the red pixel R is transmitted to a sensing processing unit SPU. If the scattered light is negligible, the third step ST3 may be omitted.

At a fourth step ST4, whether all the red, green and blue pixels R, G and B corresponding to the $n^{th}$ gate line are sensed is judged. If all the red, green and blue pixels R, G and B corresponding to the $n^{th}$ gate line are not sensed (No), the second to fourth steps ST2 to ST4 are repeated. If all the red, green and blue pixels R, G and B corresponding to the nth gate line are sensed (Yes), the sensing process for the $n^{th}$ gate line is finished and a sensing process for an $(n+1)^{th}$ gate line will be performed.

Consequently, in the LCD device according to an embodiment of the invention and the method of driving the same, interference between light of different colors is prevented because red, green and blue pixels sequentially sense images. Moreover, distortion by dummy sensing data signals is prevented because the dummy sensing data signals due to scattered light is reset before reading a normal sensing data signal. As a result, a sensing property is improved.

It will be apparent to those skilled in the art that various modifications and variations can be made in the liquid crystal display device and the method of driving the same of embodiments of the invention without departing from the spirit or scope of the invention. Thus, it is intended that embodiments of the invention cover the modifications and variations of this invention provided they come within the scope of the appended claims and their equivalents.

What is claimed is:
1. A liquid crystal display device, comprising:
a first data line and a second data line, the first and second data lines being substantially parallel to one another;
a first gate line and a second gate line, the first and second gate lines being substantially parallel to one another;
a display sub-pixel defined by crossing the first gate and data lines, the display sub-pixel including a first switching element and a first storage capacitor, the display sub-pixel transmitting light supplied from a light source in accordance to a data signal applied to the first data line;
a sensing sub-pixel defined by crossing the second gate and data lines, the sensing sub-pixel including an image sensor, second switching element and a second storage capacitor, the sensing sub-pixel sensing light incident on the liquid crystal display device and generating charges corresponding to the sensed light;
a sensing processing unit for reading normal charges stored in the second storage capacitor;
a ground terminal for resetting abnormal charges stored in the second storage capacitor: and
a third switching element for connecting the second data to the sensing processing unit directly and disconnecting the second data line from the ground terminal in accordance with storing the normal charge in the second storage capacitor, and for connecting the second data line to the ground terminal directly and disconnecting the second data line from the sensing processing unit in accordance with storing the abnormal charge in the second storage capacitor,
wherein, when the light enters the image sensor, a photo current of the image sensor is stored in the second storage capacitor, and
wherein, when the second switching element is turned on, the charges in the second storage capacitor is read by the sensing processing unit through the second switching element and the second data line.
2. The device according to claim 1, wherein:
the first switching element is connected to the first gate and data lines; and
the second switching element is connected to the second gate and data lines.
3. The device according to claim 1, wherein:
the second switching element is connected to a common line and a power line; and
the third switching element is connected to the second data.
4. A liquid crystal display device, comprising:
a plurality of first and second data lines, the plurality of first data lines being alternatively arranged with the plurality of second data lines;
a plurality of first and second gate lines, the plurality of first gate lines being alternatively arranged with the plurality of second gate lines;
a plurality of first sub-pixels defined by crossing the plurality of first gate and data lines, the plurality of first sub-pixels being activated to display all image by selectively transmitting light irradiated from a rear side of the liquid crystal display device;
a plurality of second sub-pixels defined by crossing the plurality of second gate and data lines, the plurality of second sub-pixels being selectively activated to sense one color light irradiated onto a front side of the liquid crystal display device, the plurality of first and second sub-pixels being located alternatively with one another, each of the plurality of second sub-pixels including an image sensor, switching element, and a storage capacitor;
a sensing processing unit for reading normal charges stored in each of the plurality of second sub-pixels;
a ground terminal for resetting abnormal charges stored in each of the plurality of second sub-pixels; and a switching element for connecting each of the plurality of second data lines to the sensing processing unit directly and disconnecting each of the plurality of second data lines from the ground terminal in accordance with storing the normal charge in the second sub-pixels, and for connecting each of the plurality of second data lines to the ground terminal directly and disconnecting each of the plurality of second data lines from the sensing processing unit in accordance with storing the abnormal charge in the second pixels, wherein, when the light enters the image sensor, a photo current of the image sensor is stored in the storage capacitor, and wherein, when the switching element is turned on, the charges in the storage capacitor is read by the sensing processing unit through the switching element and each of the plurality of second data line.

5. The device according to claim 4, wherein each of the plurality of first sub-pixels include a first color display sub-pixel, a second color display sub-pixel, and a third color display sub-pixel, the first, second, and third color display sub-pixels being sequentially driven.

6. The device according to claim 4, wherein each of the plurality of second sub-pixels include a first color sensing sub-pixel, a second color sensing sub-pixel, and a third color sensing sub-pixel, the first, second, and third color sensing sub-pixels sequentially generating intensity signals.

7. The device according to claim 6, wherein the sensing processing unit is selectively connected to receive the intensity signals from one of the first, second, and third color sensing sub-pixels.

8. A method of driving a liquid crystal display device including a plurality of display sub-pixels by crossing a plurality of first gate and data lines, a plurality of sensing sub-pixel by crossing a plurality of second gate and data lines, a sensing processing unit for reading normal charges stored in each of the plurality of sensing sub-pixels, a ground terminal for resetting abnormal charges stored in each of the plurality of sensing sub-pixels, and a switching element for connecting each of the plurality of second data lines to the sensing processing unit directly and disconnecting each of the plurality of second data lines from the ground terminal in accordance with storing the normal charge in the plurality of sensing sub-pixels, and for connecting each of the of second data lines to the ground terminal directly disconnecting each of the plurality of second data lines from the sensing processing unit in accordance with storing the abnormal charge in the plurality of sensing sub-pixels, the display sub-pixel including first, second, and third color display sub-pixels and wherein the sensing sub-pixel includes of first, second, and third color sensing sub-pixels, the method comprising:

in a display mode, sequentially activating the first, second, and third color display sub-pixels in a display mode; and in a sensing mode:
sensing an object by one of the first, second, and third color sensing sub-pixels;
storing a normal sensing data in one of the first, second, and third color sensing sub-pixels; and
resetting an abnormal sensing data stored in the other two of first, second, and third color sensing sub-pixels by a scattered light of the object.

9. The method according to claim 8, wherein:
the first, second, and third color display sub-pixels correspond to red, green, and blue color display sub-pixels, respectively;
the first, second, and third color sensing sub-pixels correspond to red, green, and blue color sensing sub-pixels; and
in the sensing mode, activating one of the first, second, and third color sensing sub-pixels includes:
supplying a gate signal of a high level voltage to an $n^{th}$ gate line to turn on at least three first switching elements and at least three second switching elements connected to the $n^{th}$ gate line;
sequentially supplying a first display data signal to one of the red, green, and blue display sub-pixels through one of a red display data line, a green display data line, and a blue display data line; and
reading a sensing data signal in the red, green, and blue sensing sub-pixels through a red sensing data line, a green sensing data line, and a blue sensing data line, respectively.

10. The method according to claim 9, further comprising:
in the sensing mode, supplying a second display data signal to two of the red, green, and blue display sub-pixels through two of the red, green, and blue display data lines, the second display data signal having a voltage lower than the first display data signal and one of the red, green, and blue display sub-pixels receiving one of the first and second display data signals at a time period.

11. The method according to claim 10, wherein the first and second display data signals respectively correspond to maximum and minimum transmittances of each of the red, green, and blue display sub-pixels.

12. The method according to claim 9, wherein the reading the sensing data signal includes transmitting the sensing data signal in one of the red, green, and blue sensing sub-pixels to a sensing processing unit through one of the red sensing data line, the green sensing data line, and the blue sensing data line.

13. The method according to claim 8, wherein:
the first, second, and third color display sub-pixels correspond to red, green, and blue color display sub-pixels, respectively;
the first, second, third color sensing sub-pixels correspond to red, green, and blue color sensing sub-pixels; and
in the sensing mode, activating the first, second, and third color sensing sub-pixels includes:
supplying a gate signal of a high level voltage to an $n^{th}$ gate line to turn on at least three first switching elements connected to the $n^{th}$ gate line;
supplying the gate signal of a high level voltage to an $(n+1)^{th}$ gate line to turn on at least three second switching elements connected to the $(n+1)^{th}$ gate line;
sequentially supplying a first display data signal to the red, green, and blue display sub-pixels through a red display data line, a green display data line, and a blue display data line, respectively; and
reading a sensing data signal in the red, green, and blue sensing sub-pixels through a red sensing data line, a green sensing data line, and a blue sensing data line, respectively.

14. The method according to claim 13, further comprising in the sensing mode, supplying a second display data signal to two of the red, green, and blue display sub-pixels through two of the red, green, and blue display data lines, the second display data signal having a voltage lower than the first display data signal and each of the red, green, and blue display sub-pixels receiving one of the first and second display data signals at a time period.

15. The method according to claim 14, wherein the first and second display data signals respectively correspond to maximum and minimum transmittances of each of the red, green, and blue display sub-pixels.

16. The method according to claim 13, wherein the reading the sensing data signal includes transmitting the sensing data signal in one of the red, green, and blue sensing sub-pixels to a sensing processing unit through one of the red sensing data line, the green sensing data line, and the blue sensing data line.

17. The method according to claim 8, further comprising, in the sensing mode:
  during a first sub-period, activating a first color sensing sub-pixel and resetting the second color sensing sub-pixel and the third color sensing sub-pixel;
  during the second sub-period, activating a second color sensing sub-pixel and resetting the first color sensing sub-pixel and the third color sensing sub-pixel; and
  during the third sub-period, activating a third color sensing sub-pixel and resetting the first color sensing sub-pixel and the second color sensing sub-pixel.

18. The method according to claim 8, wherein the resetting the sensing sub-pixels includes grounding charges generated at the sensing sub-pixels.

* * * * *